United States Patent [19]

Poletto et al.

[11] Patent Number: 4,721,920
[45] Date of Patent: Jan. 26, 1988

[54] BROAD-BAND INTEGRATOR

[75] Inventors: Vanni Poletto, Camino; Marco Siligoni, Vittuone, both of Italy

[73] Assignee: Cselt Centro Studi e Laboratori Telecomunicazioni S.p.A., Turin, Italy

[21] Appl. No.: 901,301

[22] Filed: Aug. 27, 1986

[30] Foreign Application Priority Data

Sep. 23, 1985 [IT] Italy ............................ 67809 A/85

[51] Int. Cl.$^4$ ............................................. H03F 3/45
[52] U.S. Cl. ................................. 330/255; 330/257; 330/260; 330/261
[58] Field of Search ................. 330/255, 257, 260, 261

[56] References Cited

U.S. PATENT DOCUMENTS 4,163,908 8/1979 Price ............................... 330/255 X

OTHER PUBLICATIONS

Brokaw et al, "A Fast, High-Precision, Laser-Trimmed FET Input Operational Amplifier", 1974, *IEEE International Solid-State Circuits Conference*, Feb. 14, 1974, pp. 142, 143, 244, 330-257.

*Primary Examiner*—James B. Mullins
*Attorney, Agent, or Firm*—Karl F. Ross; Herbert Dubno

[57] ABSTRACT

The broad-band integrator uses bipolar transistors with single low-value integration capacitor, that is why it is easy to integrate. A bias circuit, which can be integrated, allows both the gain-bandwidth product (G*B) and the absolute values of the currents in the transistors to be programmed by two external resistors. A plurality of integrators, typically sixteen, can be connected to the same bias circuit thanks to their small power consumption.

2 Claims, 5 Drawing Figures

PRIOR ART

BROAD-BAND INTEGRATOR

FIELD OF INVENTION

The present invention relates to electronic circuits implemented by bipolar integrated circuits and, more particularly, to a broad-band integrator, particularly suited to build analog filters.

BACKGROUND OF THE INVENTION

Various techniques for implementing electrical filters with active circuits, which use, in particular, integrated circuits in bipolar or MOS technology, are known.

Such filters no longer require the use of expensive and cumbersome inductors, yet they require the use of external capacitors, since high-value capacitors and active elements are difficult to integrate on the same chip. This problem has been partly resolved by implementing switched-capacitor filters in MOS technology, so that capacitors can also be integrated therein. That is made possible thanks to the easy integration of capacitors and switches typical of MOS technology.

Yet serious compatibility problems arise when an MOS circuit is to be inserted into a bipolar circuit, both owing to different input impedance values and to different breakdown voltages.

Unluckily, switched-capacitor filters cannot be easily implemented in bipolar technology, since the specific capacity is equal to about half that obtainable with MOS technology, which entails large area occupancy and difficult implementation of switches.

Integrated circuits capable of implementing analog filters in bipolar technology have been proposed in an article entitled "Integration of analog filters in a bipolar process", by J. O. Voorman et alii, IEEE Journal of Solid-state Circuits, Vol. SC-17, No. 4, August 1982.

The authors start with a classical LC network which is by using integrated capacitor and inductances simulated by integrated active circuits, comprising at least one integrated capacitor.

The circuit which simulates the inductance, implemented according to classical solutions, is dependent only on the integrated capacitor, not on the integrated resistances, hence frequency stability and accuracy exclusively depend on said capacitor.

However, filters thus implemented demand in their applications at frequencies of the order of KHz the integration of capacitors with high capacity values and different from each other, hence they have limited versatility. In addition, also the resistance values must be high, to have high values of RC constants, and hence considerable space is taken up by their integration.

Another problem to be solved while designing the output stages of integrators or compensated operational amplifiers is the instability due to the presence of a zero with positive real value in the transfer function. In particular the problem arises when the current in the integrating or compensating capacitor is controlled by the collector of the voltage-amplifier transistor, driving the output stage. One way of overcoming the disadvantage is that of connecting a resistance in series with the capacitor, yet zero compensation is not highly accurate, since generally an over-compensation is effected for security reasons. This results in a zeroing value with a negative real part and a null imaginary part. Another way of overcoming the disadvantage is that of charging the capacitor through an emitter follower, which does not exclude the rise of oscillations due to the introduction of a further active element in the feedback loop.

Still another disadvantage presented by said circuits is due to limited voltage range of the signals which can be handled. In fact currents in transistors are to be kept low in order to have high collector impedance and hence reduce as much as possible the influence of the low-frequency parasitic pole.

Since resistances higher than a certain value are not feasible, voltages have to be kept low, and hence the signals which can be handled must present limited maximum voltages.

SUMMARY OF THE INVENTION

The disadvantages above are overcome by the broad-band integrator provided by the present invention which uses bipolar active elements to implement electrical filters wherein both inductances and capacities are simulated. Their values depend on resistive networks integrated with the active elements.

The transistor currents can be chosen at will, and hence considerable input and output dynamic ranges can be achieved. Also the integrator provided by the invention ensures the dependence of filter cutoff frequencies on the only integrated capacitor and not on the resistors.

There is provided by the present invention a broad-band integrator to implement electrical filters, whose equivalent capacities, inductances and resistances are obtained by interconnecting through resistive attenuators a plurality of integrators which are connected to a bias circuit for the control of quiescent-current values and of gain-bandwidth product (G.B.) and are implemented as a bipolar-element integrated-circuit, the broad-band integrator comprising:

an input differential amplifier, consisting of a pair of transistors whose bases are connected to the inverting and noninverting inputs and whose emitters are mutually connected by a resistor;

a first current mirror, feeding the emitters of said differential amplifier;

a first transistor driving the first current mirror;

a current multiplier, consisting of a first pair of transistors with the bases connected to the amplifier transistor collectors, with the emitters mutually interconnected and connected to a second transistor operating as a current generator, and of a second pair of transistors with their bases connected to the base of the current generator, the emitters connected to the bases of the transistors of the first pair and to the collectors of the input differential pair;

a second current mirror, driving said second pair of transistors;

a third transistor, driving the second current mirror;

a third current mirror, operating as active load for said first pair of transistors;

an amplifying state, consisting of:
a fourth transistor, whose base is connected to the collector of one of said first pair of transistors, the collector is fed by the second current mirror and is connected to a reference-voltage generator;
a fifth transistor, whose base is connected to the emitter of the fourth transistor, whose emitter is common and whose collector is fed by the second current mirror;
a sixth transistor, whose base is connected to the collector of whose fifth transistor, whose collector is common and the emitter is directly connected to the output;

a seventh transistor, whose base is connected to the emitter of whose fourth transistor, whose emitter is common and the collector is connected to the emitter of the sixth transistor; and a capacitor, connected between the base of the fourth transistor and the base of the sixth transistor.

BRIEF DESCRIPTION OF THE DRAWING

The foregoing and other characteristics of the present invention will be made clearer by the following description of a preferred embodiment thereof illustrated in, given by way of example and not in a limiting the accompanying drawing in which.

SPECIFIC DESCRIPTION

Figure 1:
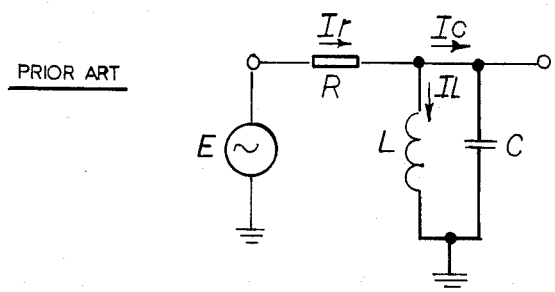
FIG. 1 is a classical RLC network.

The example of the invention here described is a simple network with inductances, capacities and resistances, similar to that represented in FIG. 1. More particularly a parallel resonant circuit is concerned, wherein capacitor C and inductor L are fed through resistor R. The output is at the resonant-circuit terminals.

The directions of currents Ir, Ie, Ic, which flow across the components, are indicated by the arrows.

Figure 2:
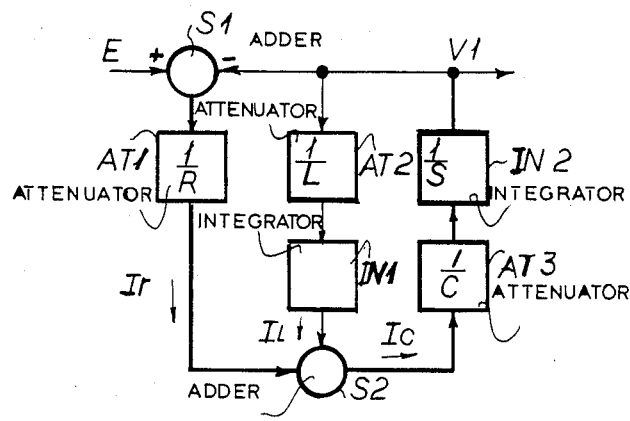
FIG. 2 is a block diagram equivalent to the network of FIG. 1.

This network can be considered in terms of an equivalent circuit composed of only integrators, adders and attenuators, as has been represented in FIG. 2.

The input signal E enters adder S1 and through a first attenuator AT1, with a transfer function equal to 1/R, reaches a second adder S2, whose output is connected to an attenuator AT3, with a transfer function 1/C, and arrives at integrator IN2.

Integrator IN2, with a transfer function 1/s (s is the complex variable), supplies signal v1 to S1 inverting input and to an attenuator AT2, with transfer function 1/L.

A second integrator IN1 sends the signal received from AT2 towards the inverting input of adder S2. References characters v1, Ir, Il, Ic refer to voltages and currents characterizing the blocks which simulate magnitudes R, L and C.

Figure 3:
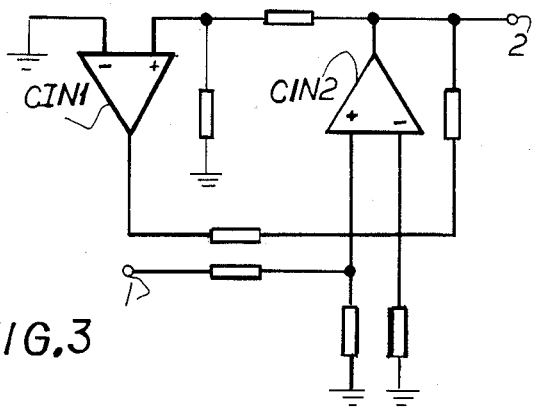
FIG. 3 is an electrical diagram of the network of FIG. 1, implemented by integrators.

The electrical diagram of the active filter can be derived from the block diagram of FIG. 2, shown in FIG. 3. References CIN1 and CIN2 denote two integrators with differential inputs, which implement both the integrating and the adding functions of the blocks represented in preceding Figure. These integrators actually have a transfer function of GB/s type, where GB is the amplifier gain-bandwidth product. Hence the resistive values, which can be calculated by known methods, have to be determined by taking into account GB, as well as the dynamic range and desired values of R, C and L of the filter. Besides in FIG. 3 reference numerals 1 and 2 denote the filter input and output respectively.

Figure 4:
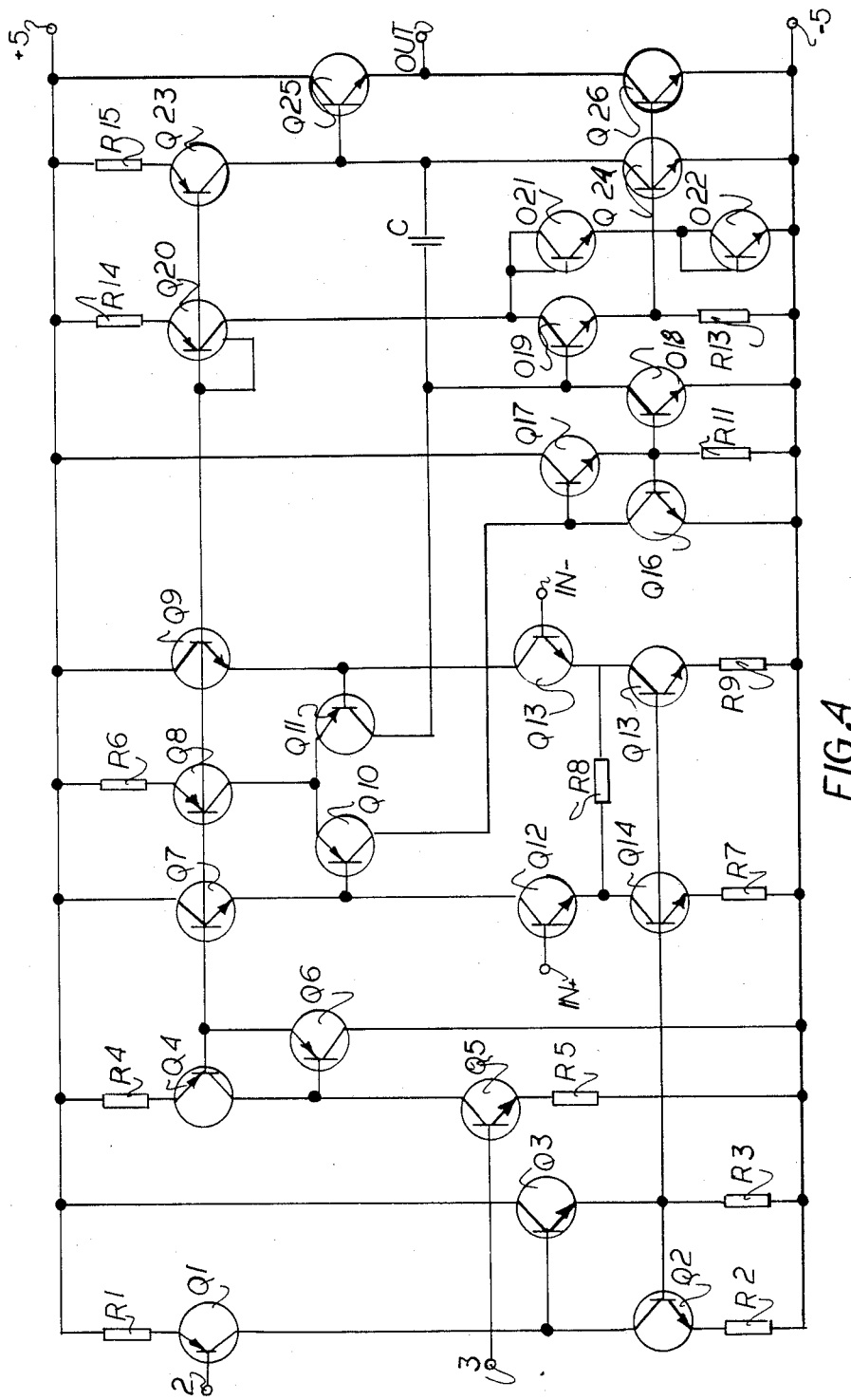
FIG. 4 is an electric diagram of the integrator.

The detailed electrical diagram of an integrator apt to implement said filter is shown in FIG. 4.

Positive and negative power supply sources are connected to the terminals denoted by +5 and −5 respectively.

Noninverting IN+ and inverting IN− inputs are connected to a differential amplifier consisting of NPN transistors Q12, Q13 interconnected through the emitter resistor R8, through which the input differential voltage is converted into current. Q12 and Q13 collectors are connected to the bases of the pairs of PNP transistors Q10, Q11 and to the emitters of the pair of NPN transistors Q7, Q9. The latter two pairs implement a current multiplier, insensitive to the offsets of the individual pairs.

The input of the multiplier is located at the emitters of Q7, Q9, the outputs at the collectors of Q10, Q11, the multiplying coefficient is given by the ratio between the current which traverses PNP transistors Q8 and the sum of the currents which traverse NPN transistors Q14 and Q15. The collector of Q8 feeds the two emitters of Q10, Q11, while the emitter is connected to the power supply source through R6. The collectors of the pair Q14, Q15 are connected to the emitters of the pair Q12, Q13 and the emitters of the pair Q14, Q15 are connected to the negative power supply source through resistors R7, R9.

NPN transistors Q19, Q24, Q25 implement an amplifying stage with high input impedance, low output impedance and sufficient voltage gain.

Transistor Q19 has its base connected to Q11 collector and its emitter connected through R13 to the negative power supply source and directly to Q24 base, placed in the common emitter configuration. The collector of Q24 feeds Q25 base, whose collector is common and whose emitter is connected to the collector of Q26 and to the output terminal, denoted by OUT.

Transistors Q19 and Q26 are fed by PNP transistors Q20 and Q23, whose emitters are connected to the power supply source through resistors R14 and R15.

Two NPN transistors Q21 and Q22, with short-circuited bases and collectors, are connected in series with the negative power supply ource and in parallel with Q19 collector. Said transistors establish a voltage reference which prevents Q19 saturation.

NPN transistors Q16 and Q18 form a current mirror which is used as an active load of the pair Q10 and Q11. NPN transistor Q17 feeds the mirror. NPN transistor Q26 has its base connected to Q24 base and the emitter to the negative power supply source.

Integrating capacitor C is connected between Q11 collector and Q25 base.

The elimination of zero with positive real part occurs thanks to the connection of Q24 and Q26 in parallel, as far as the respective bases and emitters are concerned, which operates so that their collector currents be proportional.

Hence the zero present on Q25 base, connected to Q24 collector, is eliminated on Q25 emitter and hence at the output, connected to Q26 collector.

Transistor Q20 through a second collector feeds the emitter of a PNP transistor Q6, besides supplying the low currents necessary to its base and to Q4, Q7, Q8, Q9, Q23 bases.

The ratios between the currents of these last transistors are established by resistors R4, R6, R14 and R15, while the absolute values depend on the potential difference between the positive power supply source and the conductor of the bases of Q4, Q7, etc. This potential difference depends on the current flowing in Q4, controlled by NPN transistor Q5, connected to the negative power supply source via R5 and to the positive source via Q4 and R4.

The base of Q5, denoted by 3, is connected to the bias circuit, which will be described hereinafter.

PNP transistor Q2 forms with Q14 and Q15 a current mirror, fed by NPN transistor Q3 and driven by PNP transistor Q1. Also Q1 base, denoted by 2, is connected to the bias circuit. It allows a programmed variation of the current in Q1 and hence, through the current mirror formed by Q2, Q3, Q14 and Q15, of the current in Q12 and Q13. The variation of the ratio between the current in Q8 and the sum of the currents in Q12 and Q13 changes the gain-bandwidth product (G.B) of the integrator.

Figure 5:
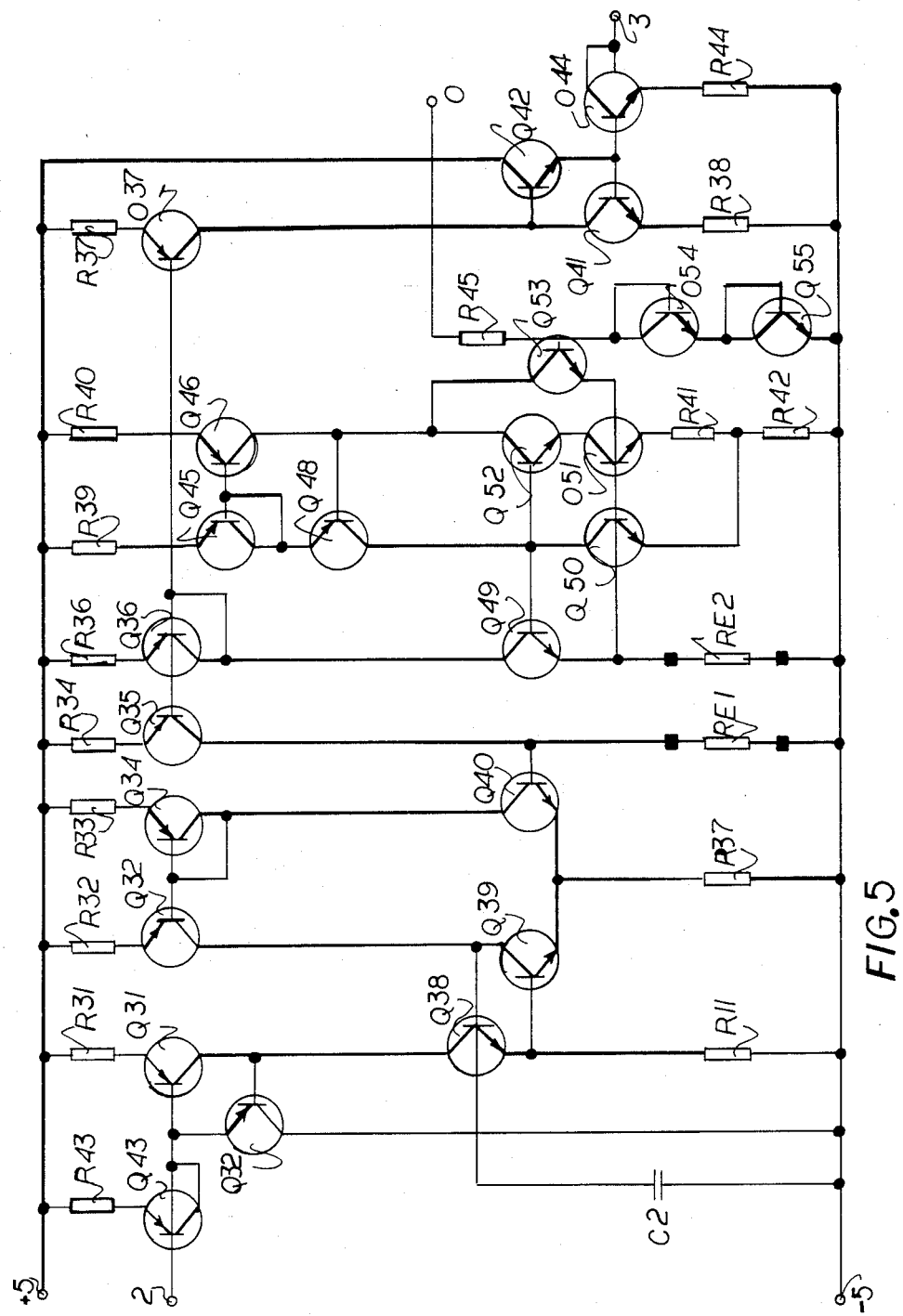
FIG. 5 is an electrical diagram of the bias circuit.

The diagram of the bias circuit, apt to supply the bias current for one or more integrators (e.g. 16), is shown in FIG. 5.

In this Figure +5,0 and −5 denote the terminals to be connected to a positive power supply source, to ground and to a negative source respectively.

PNP transistors, denoted by Q45, Q46 and Q48 form with NPN transistors Q49, Q50, Q51 and Q52 and resistors R39, R40, R41 and R42 a source of reference voltage, available at Q49 emitter. This circuit is already known in the art as "Band-gap". It is associated with a starter circuit, usually employed to determine the operating point of the reference-voltage source.

In fact, said circuit presents two stable conditions corresponding to an output voltage of 0 and 1.3 V. The starter circuit, consisting of NPN transistors Q53, Q54 and Q55 and of resistor R45, eliminates the first operating point with 0-volt output.

Q49 emitter current is determined by a resistor RE2, external to the integrated circuit. Hence Q49 collector current results determined. This transistor feeds a current mirror consisting of PNP transistors Q35, Q36 and Q37. Their emitters are connected to the positive-voltage source by resistors R34, R36 and R37, respectively.

Transistor Q37 feeds in turn a current mirror consisting of NPN transistors Q41, Q42 and Q44 and of transistors Q5 (FIG. 4) of all the integrators connected to terminal 3. Resistors R38 and R44 connect Q41 and Q44 emitters to the negative power supply source.

Q35 collector current traverses resistor RE1, outside the integrated circuit, by which it can be then determined the voltage at the input of an operational amplifier, with unitary gain, composed of NPN transistors Q40, Q39 and Q38. The emitters of Q39 and Q40, forming the differential input pair, are connected to the negative power supply source through resistor R37, while the collectors are connected to the positive power supply source through active loads formed by PNP transistors Q33, Q34 and by resistors R32 and R33.

The emitter current of amplifier Q38 traverses resistor RI1 and originates a voltage drop equal to that present at RE1 terminals. The collector current of Q38 feeds a current mirror composed of transistors Q31, Q32, Q43 and of transistors Q1 of all the integrators connected to terminal 2.

As usual Q32 and Q43 are used to feed the mirror, together with resistors R43 and R31 connected to the positive power supply source.

Capacitor C2 stabilizes the loop composed of Q38 and Q39 in the frequency domain.

As previously seen the integrator transfer function depends on the gain-bandwidth product (G.B), which depends in turn on the ratio between the current traversing Q8 (FIG. 4) and the current traversing Q14 and Q15.

This ratio can be varied on the basis of the value assigned to resistor RE1 (FIG. 5). In fact, its variation causes a current variation in Q38 and in the mirror composed of Q31 and Q1 (FIG. 4). As a consequence, the current changes in the mirror composed of Q2, and Q14, Q15. Otherwise, the current in Q8 does not change as long as the current in Q5 remains unchanged.

As previously seen, the latter current depends on the value of resistor RE2 (FIG. 5), which in this case has not changed. Thus a new G.B value is obtained.

If, however, only resistor RE2 varies, the collector current of Q49 varies and hence those of Q37 and Q35. The variation of Q35 current arrives through the operational amplifier consisting of Q40, Q39 and Q38 at the mirror consisting of Q31 and Q1 (FIG. 4). Since Q1 drives the mirror consisting of Q2, Q14 and Q15, also the collector currents of Q14 and Q15 vary.

The variation in the collector current of Q37 (FIG. 5) arrives through the mirror consisting of Q41 and Q5 (FIG. 4) on the mirror consisting of Q4, Q8, etc . . . , hence Q8 collector current varies too.

Variations in Q8 and in Q14, Q15 are such that their ratio keeps constant, that is why the G.B product remains constant as RE2 varies. However, a general variation in the absolute current values is obtained in order to maintain a good dynamic range also for particularly high and low G.B products.

The integrated circuit can consist of a bias circuit, of 16 integrators and of a plurality of resistors, whereby the attenuators are implemented for connecting the integrators to each other, in order to obtain the desired transfer function.

In a preferred embodiment of the integrated circuit the following resistance and capacity values have been used:

| | |
|---|---|
| R1, R5, R8, R31, R38, R43, R44, R45, RI1 | 40KO |
| R2, R4, R34, R35, R36 | 10KO |
| R3, R11, R13 | 60KO |
| R6, R14, R32, R33 | 5KO |
| R7, R9 | 2.5KO |
| R15 | 1.67KO |
| R37 | 20KO |
| R39, R40 | 17KO |
| R41 | 0.6KO |
| R42 | 3KO |
| RE1 | 22KO |
| RE2 | 26KO |
| C | 15pF |

It is clear that what described has been given by way of non-limiting example. Variations and modifications are possible without going out of the scope of the present invention.

What is claimed is:

1. A broad-band integrator to implement electrical filters, whose equivalent capacities, inductances and resistances are obtained by interconnecting through resistive attenuators a plurality of said integrators, which are connected to a bias circuit for the control of quiescent-current values and of gain-bandwidth product (G.B) and are apt to be implemented as a bipolar-element integrated-circuit, the integrator being characterized in that it comprises:

an input differential amplifier, consisting of a pair of transistors (Q12, Q13), whose bases are connected to the inverting (IN−) and noninverting (IN+) inputs and whose emitters are mutually connected by a resistor (R8);

a first current mirror, (Q3, Q2, Q14, Q15) feeding the emitters of said differential amplifier;

a first transistor (Q1) driving the first current mirror;

a current multiplier, consisting of a first pair of transistors (Q10, Q11) with their bases connected to the amplifier transistor collectors, with the emitters mutually interconnected and connected to a second transistor (Q8) operating as a current generator, and of a second pair of transistors (Q7, Q9), with their bases connected to the base of the current generator, the emitters connected to the bases of the transistors of the first pair and to the collectors of the input differential pair;

a second current mirror (Q6, Q20, Q23), driving said second pair of transistors;

a third transistor (Q5), driving the second current mirror;

a third current mirror (Q17, Q16, Q18), operating as active load for said first pair of transistors;

an amplifying stage, consisting of;

a fourth transistor (Q19), whose base is connected to the collector of said first pair of transistors (Q11), the collector is fed by the second current mirror and is connected to a reference voltage generator (Q21, Q22);

a fifth transistor (Q24), whose base is connected to the emitter of the fourth transistor, the emitter is common and the collector is fed by the second current mirror;

a sixth transistor (Q25), whose base is connected to the collector of the fifth transistor, the collector is common and the emitter is directly connected to the output (OUT);

a seventh transistor (Q26), whose base is connected to the emitter of the fourth transistor, the emitter is common and the collector is connected to the emitter of the sixth transistor; and a capacitor (C), connected between the base of the fourth transistor (Q19) and the base of the sixth transistor (Q25), said bias circuit comprising:

a reference voltage generator (Q45, Q46, Q48, Q52, Q50, Q51);

a starter circuit (Q53, Q54, Q55), to establish the desired stable condition of the reference-voltage generator;

an eighth transistor (Q49), whose base is connected to the reference voltage generator and the emitter to a first external resistor (RE2), through which collector current is determined;

a fourth current mirror (Q35, Q36, Q37), driven by the eighth transistor;

a fifth current mirror (Q42, Q41, Q44), driven by the fourth current mirror and capable of driving a plurality of said third transistors (Q5) belonging to different integrators;

an operational amplifier (Q40, Q39, Q38), with unitary voltage gain, which has the noninverting input connected to a second external resistor (RE1), wherethrough the current due to the fourth current mirror flows;

a sixth current mirror (Q32, Q31, Q43), driven by the operational amplifier and capable of driving a plurality of said first transistors (Q1) belonging to different integrators.

2. A broad-band integrator for the implementation of an electrical filter with a programmable gain-bandwidth product and implemented as a bipolar-element integrated circuit, comprising:

an input differential amplifier having a pair of differential-amplifier transistors with bases respectively connectable to an inverting input and to a noninverting input, and a differential-amplifier resistor connecting emitters of said differential-amplifier transistors;

a first current mirror feeding the emitters of said differential-amplifier transistors;

a first transistor connected to and driving said first current mirror;

a current multiplier including:
  a pair of first current-multiplier transistors having respective bases connected to said differential-amplifier transistors, and mutually connected emitters,
  a second transistor forming a current generator and connected to the emitters of said first current-multiplier transistors, and
  a pair of second current-multiplier transistors having bases connected to the base of said second transistor, and emitters connected to the bases of said first current-multiplier transistors and to collectors of said differential-amplifier transistors;

a second current mirror connected to and driving said pair of second current-multiplier transistors;

a third transistor connected to and driving said second current mirror;

a third current mirror connected to said pair of first current-multiplier transistors and operating as an active load therefor;

an amplifying stage connected to said pair of first current-multiplier transistors and to said second current mirror, said amplifying stage including:
  a fourth transistor having a base connected to a collector of one of said pair of first current-multiplier transistors, and a collector fed by said second current mirror,
  a reference voltage generator connected to said collector of said fourth transistor,
  a fifth transistor having a base connected to an emitter of said fourth transistor, a common emitter and a collector fed by said second current mirror,
  a sixth transistor having a base connected to the collector of said fifth transistor, a common collector and an emitter directly connected to an output terminal,
  a seventh transistor having a base connected to an emitter of said fourth transistor, a common emitter and a collector connected to the emitter of said sixth transistor; and
  a capacitor connected between the base of the fourth transistor and the base of said sixth transistor.

* * * * *